(12) United States Patent
He et al.

(10) Patent No.: US 10,914,801 B2
(45) Date of Patent: Feb. 9, 2021

(54) METHOD, DEVICE AND DIGITAL RECEIVER FOR TRANSMITTING SIGNALS IN MAGNETIC RESONANCE IMAGING

(71) Applicant: Siemens Healthcare GmbH, Erlangen (DE)

(72) Inventors: Jin Qiang He, Shenzhen (CN); Guang Bao Dai, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/369,531

(22) Filed: Mar. 29, 2019

(65) Prior Publication Data

US 2019/0302202 A1    Oct. 3, 2019

(30) Foreign Application Priority Data

Mar. 29, 2018   (CN) .......................... 2018 1 0269395

(51) Int. Cl.
*G01R 33/36* (2006.01)
*G01R 33/54* (2006.01)

(52) U.S. Cl.
CPC ....... *G01R 33/3621* (2013.01); *G01R 33/543* (2013.01)

(58) Field of Classification Search
CPC .............. G01R 33/3621; G01R 33/543; G01R 33/3664; G01R 33/283
See application file for complete search history.

(56) References Cited

U.S. PATENT DOCUMENTS

| 8,384,388 | B2* | 2/2013 | Biber | ................ | G01R 33/3415 324/318 |
| 2004/0193038 | A1* | 9/2004 | Reykowski | ............ | G01R 33/54 600/410 |
| 2005/0275402 | A1 | 12/2005 | Campagna | | |
| 2015/0091561 | A1* | 4/2015 | Dai | .................... | G01R 33/3621 324/307 |
| 2015/0244482 | A1* | 8/2015 | Biber | .................... | A61B 5/055 370/480 |

* cited by examiner

*Primary Examiner* — G. M. A Hyder
(74) *Attorney, Agent, or Firm* — Schiff Hardin LLP

(57) ABSTRACT

In a method, device and digital receiver for transmitting signals in magnetic resonance imaging, M channels of digital signals are received over M receiving channels from a digital matrix processor. One receiving channel corresponds to one channel of digital signal and the M channels of digital signals include one channel of main signal and (M−1) channels of high-order signals. The M channels of digital signals are combined into N channels of combined signals, wherein the main signal and at least one channel of high-order signal are combined into one channel of combined signal, or at least two channels of high-order signals are combined into one channel of combined signal. N and M are both positive integers, N is less than M, and M is greater than or equal to 2.

11 Claims, 6 Drawing Sheets

Receiver Coil

METHOD, DEVICE AND DIGITAL RECEIVER FOR TRANSMITTING SIGNALS IN MAGNETIC RESONANCE IMAGING

BACKGROUND OF THE INVENTION

Field of the Invention

The present invention relates to the technical field of magnetic resonance imaging, and in particular relates to a method, device and digital receiver for transmitting signals in magnetic resonance imaging.

Description of the Prior Art

Magnetic resonance imaging (MRI) is a biomagnetic nucleus spin imaging technology developed rapidly along with the development of the computer technology, electronic circuit technology, and superconductor technology. In MRI, a magnetic field and radio frequency (RF) pulses are utilized to cause vibrations of hydrogen nuclei (namely, $H^+$) in precession in human tissues to produce RF signals, and an image is obtained after the RF signals are processed by a computer. When an object is placed in a magnetic field and is irradiated by suitable magnetic waves to produce resonances, the positions and types of the nuclei of the object can be obtained by analyzing the magnetic waves released from the object. On the basis of this, a precise 3-D image of the object can be plotted.

An MRI system usually includes a receiving coil, a scanning table socket, a receiving coil channel selector, an analog receiver, a digital matrix processor, a digital receiver, and an MRI module. Among them, the receiving coil receives magnetic resonance echo signals, the scanner table socket transmits the magnetic resonance echo signals over a system cable to the receiving coil channel selector, the receiving coil channel selector maps the magnetic resonance echo signals to the analog receiver, the analog receiver performs an analog-to-digital conversion for the magnetic resonance echo signals, the digital matrix processor converts the magnetic resonance echo signals after the analog-to-digital conversion into a number of digital signals, the digital receiver receives a number of digital signals over a number of receiving channels corresponding to the digital signals from the digital matrix processor and sends the number of digital signals over transmission channels to the MRI module, and the MRI module performs a Fourier transform for the digital signals to generate an MRI image.

In the prior art, when the number of receiving channels of the digital receiver for receiving digital signals is less than the number of transmission channels for sending digital signals, the digital receiver will discard some digital signals. Thus, the digital signals transmitted to the MRI module will not be complete any longer, and in addition, the imaging quality will get lower.

SUMMARY OF THE INVENTION

The present invention provides a method, device and digital receiver for transmitting signals in MRI.

A method for transmitting signals in MRI in accordance with the invention includes the following steps:

M channels of digital signals are received over M receiving channels from a digital matrix processor, wherein one receiving channel corresponds to one channel of digital signal and the M channels of digital signals include one channel of main signal and (M−1) channels of high-order signals.

The M channels of digital signals are combined into N channels of combined signals, wherein the main signal and at least one channel of high-order signal are combined into one channel of combined signal, or at least two channels of high-order signals are combined into one channel of combined signal. N and M are both positive integers, N is less than M, and M is greater than or equal to 2.

The N channels of combined signals are transmitted over N transmission channels to an MRI module, wherein one transmission channel corresponds to one channel of combined signal.

It can be seen that when the number of transmission channels is less than the number of receiving channels, the present invention realizes the complete transmission of digital signals, without any necessity of discarding digital signals through signal combinations, thus improving the imaging quality and saving the cost of increasing the number of transmission channels.

In an embodiment, M is 3 and N is 2, and the steps of receiving M channels of digital signals over M receiving channels from a digital matrix processor includes receiving a main signal, a first high-order signal and a second high-order signal over 3 receiving channels from the digital matrix processor and the step of combining M channels of digital signals into N channels of combined signals includes generating a first channel of combined signal based on the main signal, and combining the first high-order signal and the second high-order signal into a second channel of combined signal.

Therefore, the present invention can utilize one transmission channel to transmit a main signal, and another transmission channel to transmit a combined signal containing a first high-order signal and a second high-order signal.

In another embodiment, M is 3 and N is 2 and the step of receiving M channels of digital signals over M receiving channels from a digital matrix processor comprises: receiving a main signal, a first high-order signal and a second high-order signal over 3 receiving channels from the digital matrix processor, and the step of combining M channels of digital signals into N channels of combined signals includes combining the main signal and some fields in the second high-order signal into a first channel of combined signal, combining the first high-order signal and the other fields in the second high-order signal into a second channel of combined signal, or combining the main signal and some fields in the first high-order signal into a first channel of combined signal and combining the second high-order signal and the other fields in the first high-order signal into a second channel of combined signal.

Therefore, the present invention can utilize one transmission channel to transmit one combined signal containing a main signal and a second high-order signal, and another transmission channel to transmit another combined signal containing a second high-order signal and a first high-order signal.

In another embodiment, M is 4 and N is 3 and the step of receiving M channels of digital signals over M receiving channels from a digital matrix processor includes receiving a main signal, a first high-order signal, a second high-order signal and a third high-order signal over 4 receiving channels from the digital matrix processor, and the steps of combining M channels of digital signals into N channels of combined signals proceeds by generating a first channel of combined signal based on the main signal, combining the first high-order signal and some fields in the third high-order signal into a second channel of combined signal, combining the second high-order signal and the other fields in the third high-order signal into a third channel of combined signal; or generating a first channel of combined signal based on the main signal, combining the first high-order signal and some fields in the second high-order signal into a second channel of combined signal, combining the third high-order signal and the other fields in the second high-order signal into a third channel of combined signal; or generating a first channel of combined signal based on the main signal, combining some fields in the first high-order signal and the second high-order signal into a second channel of combined signal, combining the third high-order signal and the other fields in the first high-order signal into a third channel of combined signal; or generating a first channel of combined signal based on the main signal, combining some fields in the first high-order signal and the third high-order signal into a second channel of combined signal, combining the second high-order signal and the other fields in the first high-order signal into a third channel of combined signal.

Therefore, the present invention can utilize a first transmission channel to specially transmit a main signal, and a second transmission channel and a third transmission channel to respectively transmit their respective combined signals.

A device for transmitting signals in MRI includes a signal receiving module that receive M channels of digital signals over M receiving channels from a digital matrix processor, wherein one receiving channel corresponds to one channel of digital signal and the M channels of digital signals include one channel of main signal and (M−1) channels of high-order signals.

The device further includes a signal combining module that combines the M channels of digital signals into N channels of combined signals, wherein the main signal and at least one channel of high-order signal are combined into one channel of combined signal, or at least two channels of high-order signals are combined into one channel of combined signal, and wherein N and M are both positive integers, N is less than M, and M is greater than or equal to 2.

The device further includes a signal transmitting module that transmits the N channels of combined signals over N transmission channels to an MRI module, wherein one transmission channel corresponds to one channel of combined signal.

It can be seen that when the number of transmission channels is less than the number of receiving channels, the present invention realizes the complete transmission of digital signals, without any necessity of discarding digital signals through signal combinations, thus improving the imaging quality and saving the cost of increasing the number of transmission channels of the digital receiver.

In an embodiment, M is 3 and N is 2, and the signal receiving module receives a main signal, a first high-order signal and a second high-order signal over 3 receiving channels from said digital matrix processor, and said signal combining module generates a first channel of combined signal based on the main signal and combines the first high-order signal and the second high-order signal into a second channel of combined signal.

Therefore, the present invention can utilize one transmission channel to specially transmit a main signal, and another transmission channel to transmit a combined signal containing a first high-order signal and a second high-order signal.

In one embodiment, M is 3 and N is 2 and the signal receiving module receives a main signal, a first high-order signal and a second high-order signal over 3 receiving channels from the digital matrix processor.

In this embodiment, the said signal combining module combines the main signal and some fields in the second high-order signal into a first channel of combined signal and combine the first high-order signal and the other fields in the second high-order signal into a second channel of combined signal, or combine the main signal and some fields in the first high-order signal into a first channel of combined signal and combine the second high-order signal and the other fields in the first high-order signal into a second channel of combined signal.

Therefore, the present invention can utilize one transmission channel to transmit a combined signal containing a main signal and a second high-order signal, and another transmission channel to transmit another combined signal containing a second high-order signal and a first high-order signal.

In another embodiment, M is 4 and N is 3 and the signal receiving module receives a main signal, a first high-order signal, a second high-order signal and a third high-order signal over 4 receiving channels from said digital matrix processor.

In this embodiment, the signal combining module generates a first channel of combined signal based on the main signal, combine the first high-order signal and some fields in the third high-order signal into a second channel of combined signal and combines the second high-order signal and the other fields in the third high-order signal into a third channel of combined signal, or generates a first channel of combined signal based on the main signal, combine the first high-order signal and some fields in said second high-order signal into a second channel of combined signal and combines the third high-order signal and the other fields in said second high-order signal into a third channel of combined signal, or generates a first channel of combined signal based on the main signal, combine some fields in the first high-order signal and the second high-order signal into a second channel of combined signal and combines the third high-order signal and the other fields in the first high-order signal into a third channel of combined signal, or generates a first channel of combined signal based on the main signal, combine some fields in the first high-order signal and the third high-order signal into a second channel of combined signal and combines the second high-order signal and the other fields in the first high-order signal into a third channel of combined signal.

Therefore, the present invention can utilize a first transmission channel to specially transmit a main signal, and a second transmission channel and a third transmission channel to respectively transmit their respective combined signals.

A digital receiver of an MRI system includes the device for transmitting signals in MRI as described above.

The present invention also encompasses a non-transitory, computer-readable data storage medium encoded with programming instructions that, when loaded into a computer or computer system, cause the computer or computer system to operate the magnetic resonance apparatus so as to implement any or all embodiments of the method according to the invention, as described above.

DESCRIPTION OF THE PREFERRED EMBODIMENTS

To make clearer the technical solutions and advantages of the present invention, the following further describes in detail the present invention in combination with the drawings and embodiments. It should be understood that the specific embodiments described here are used only to illustrate the present invention, but not restrict the scope of protection of the present invention.

For the purposes of simplicity and intuitiveness of the description, the following gives some representative embodiments to illustrate the present invention. A large amount of details in the embodiments are only used to help to understand the solutions of the present invention. Obviously, the technical solutions of the present invention are not limited to these details, however. To avoid unnecessarily making the solutions of the present invention confused, some embodiments are not described in detail, but only their frameworks are given. Below, the term "comprise" refers to "including but not limited to" and the term "according to . . . " refers to "at least according to . . . , but not limited to only according to . . . ." In view of the codes of the language of Chinese, the number of a component hereinafter can be one or more or can even be understood as at least one, unless otherwise specified.

Figure 1:
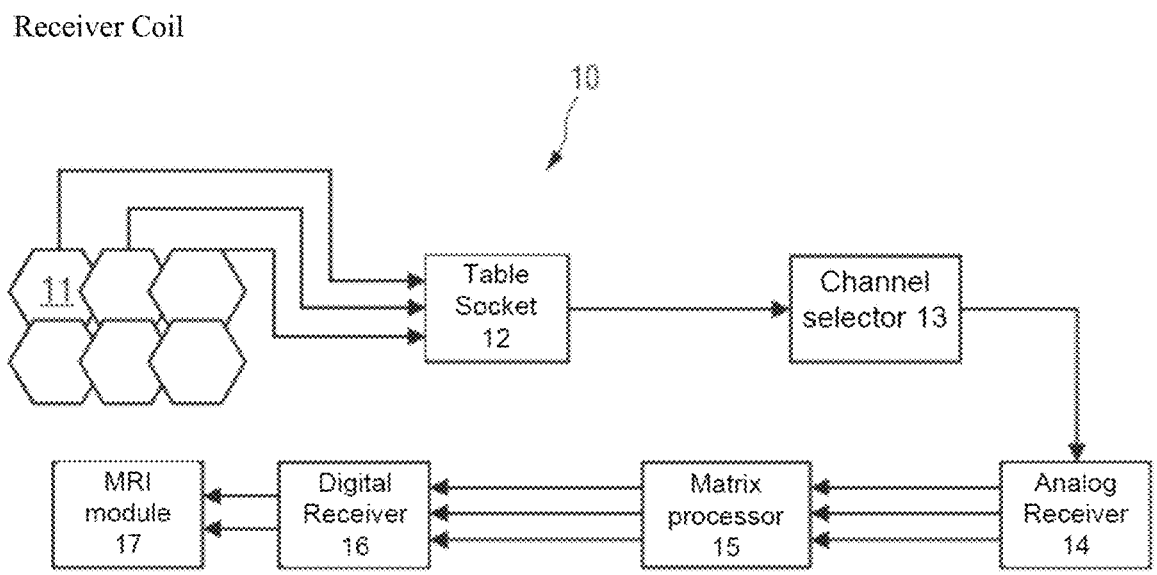
FIG. 1 shows the modules of the MRI system according to the invention.

FIG. 1 shows the modules of the MRI system.

In FIG. 1, the MRI system 10 comprises a receiving coil 11, a scanner table socket 12, a receiving coil channel selector 13, an analog receiver 14, a digital matrix processor 15, a digital receiver 16, and an MRI module 17, wherein, the receiving coil 11 comprises K coil units having connections in spatial locations, and the initial phases of K magnetic resonance echo signals received by K coil units are the space phases of the magnetic resonance echo signals; the receiving coil 11 transmits K magnetic resonance echo signals to the scanner table socket 12; the scanner table socket 12 transmits K magnetic resonance echo signals over a system cable to the receiving coil channel selector 13; the receiving coil channel selector 13 maps K magnetic resonance echo signals to the analog receiver 14; the analog receiver 14 performs an analog-to-digital conversion for K magnetic resonance echo signals, the digital matrix processor 15 converts K magnetic resonance echo signals after the analog-to-digital conversion into K digital signals, the digital receiver 16 receives K digital signals over K receiving channels corresponding to K digital signals from the digital matrix processor 15 and sends K digital signals over P transmission channels to the MRI module 17, and the MRI module 17 performs a Fourier transform for the received digital signals to generate an MRI image.

The following describes the processing by the digital matrix processor 15. The digital matrix processor 15 performs complex operations for K magnetic resonance echo signals according to specific phase relationships and outputs K mode signals. Specifically, the digital matrix processor 15 produces linear combinations for the input signals, namely, K magnetic resonance echo signals and the results of all linear combinations are K mode signals. The concept "mode" describes the sensitivity distribution, which is related to one or more antennas and is used as space function, in an antenna field. The K mode signals output by the digital matrix processor 15 comprise a main signal (also known as primary signal) and (K−1) high-order signals (also known as secondary signals). The main signal contains most information of an image and provides the maximum signal-to-noise ratio (SNR) of the central area of the image, and the high-order signals can further improve the SNR of the surrounding areas of the image. The amount of information of the main signal is significantly greater than that of high-order signals.

The main signal, which can be considered as a basic signal and processed into an MRI image, shows an image improvement, compared the MRI image separately obtained from MR signals. Such an improvement especially happens in a target area of the detection space. In the target area, the image qualities such as SNR are improved, and in addition, the sensitivity of circularly polarized nucleus spin signals is optimized Alike, high-order signals have a sensitivity distribution. However, the corresponding phase-encoding direction of high-order signals in MR signals is different from that of the main signal. For example, the corresponding phase-encoding direction of high-order signals overlaps the local antenna arrangement direction.

In the prior art, when P is less than K (that is to say, the number of receiving channels of the digital receiver 16 is less than the number of transmission channels), high-order signals will be discarded only at the cost of a small amount of loss of the overall image SNR. For example, the digital receiver 16 will discard (K-P) digital signals, and then transmit the remaining P digital signals to the MRI module 17 over P transmission channels. The MRI module 17 performs a Fourier transform for the P digital signals to generate an MRI image.

However, since the digital receiver 16 discards (K-P) digital signals during the transmission, the imaging quality of the MRI module 17 will get lower. Even if the (K-P) digital signals discarded by the digital receiver 16 are high-order signals, the imaging quality of the MRI module 17 will still be influenced.

To guarantee the imaging quality of the MRI module, a common processing way in the prior art is to increase the number of transmission channels of the digital receiver from P to K and transmit all the K digital signals to the MRI module over K transmission channels without any necessity of discarding digital signals. However, the common processing increases the number of transmission channels of the digital receiver, which inevitably results in a significant cost problem.

The Applicant finds that a complete signal transmission scheme can be realized by utilizing the differences in the amount of information between digital signals to combine digital signals so that the combined signals containing all digital signals can be transmitted over the existing transmission channels without the necessity of increasing the number of transmission channels of the digital receiver.

Figure 2:
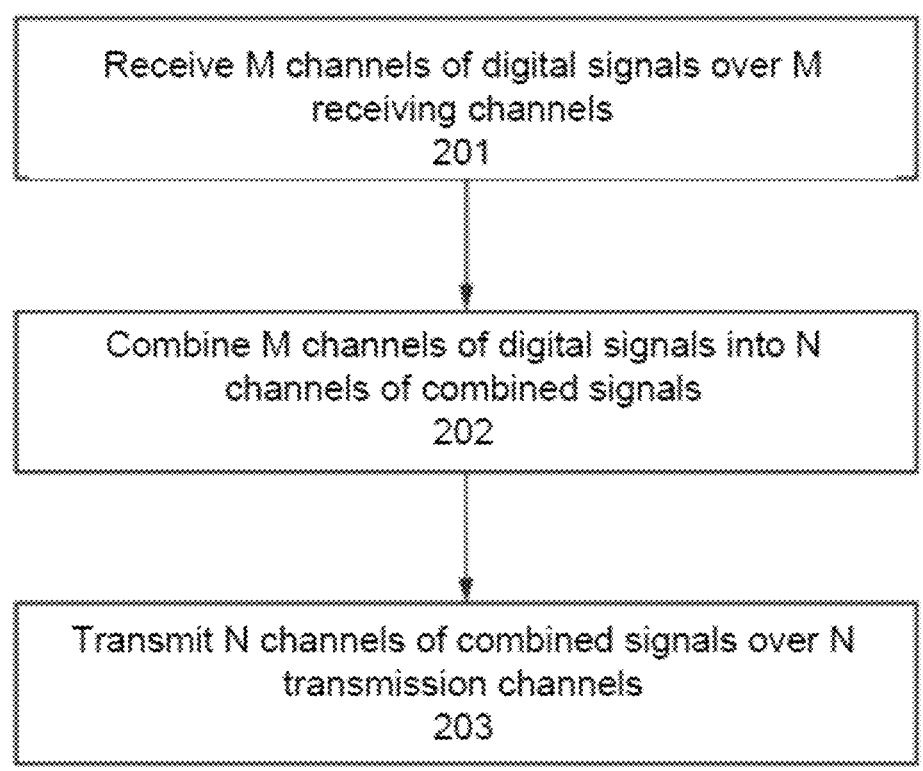
FIG. 2 is a flowchart of the method for transmitting signals in MRI in the embodiments of the present invention.

FIG. 2 is a flowchart of the method for transmitting signals in MRI in the embodiments of the present invention. The method shown in FIG. 2 can be applied to a digital receiver in the MRI system. The digital receiver has M receiving channels and N transmission channels, wherein N and M are both positive integers and N is less than M. For example, the method in FIG. 2 can be applied to the digital receiver 16 in FIG. 1.

As shown in FIG. 2, the method comprises:

Step 201: Receive M channels of digital signals over M receiving channels from the digital matrix processor, wherein one receiving channel corresponds to one channel of digital signal and the M channels of digital signals include one channel of main signal and (M−1) channels of high-order signals.

The digital receiver is connected to the digital matrix processor through M receiving channels. The digital matrix processor performs complex operations for the space phases of magnetic resonance signals received by M coil units to generate M channels of digital signals. The digital receiver receives M channels of digital signals over M receiving channels from the digital matrix processor, wherein one receiving channel corresponds to one channel of digital signal.

For example, when the digital array stored in the digital matrix processor is a 3×3 matrix, the digital matrix processor generates 3 channels of digital signals. Accordingly, the digital receiver receives 3 channels of digital signals over 3 receiving channels from the digital matrix processor, wherein each receiving channel is used to receive the corresponding one channel of digital signal. Specifically, the 3 channels of digital signals include 1 channel of main signal and 2 channels of high-order signals.

Again for example, when the digital array stored in the digital matrix processor is a 4×4 matrix, the digital matrix processor generates 4 channels of digital signals. Accordingly, the digital receiver receives 4 channels of digital signals over 4 receiving channels from the digital matrix processor, wherein each receiving channel is used to receive the corresponding one channel of digital signal. Specifically, the 4 channels of digital signals include 1 channel of main signal and 3 channels of high-order signals.

Typical instances of digital matrices and the number of receiving channels are exemplarily described above. Those skilled in the art may know that the description is only used for the exemplary purpose, but not used to limit the scope of protection of the embodiments of the present invention.

Step 202: Combine M channels of digital signals into N channels of combined signals, wherein a main signal and at least one channel of high-order signals are combined into one channel of combined signal, or at least two channels of high-order signals are combined into one channel of combined signal, N and M are both positive integers, N is less than M, and M is greater than or equal to 2.

Here, the number (N) of transmission channels of the digital receiver is less than the number (M) of receiving channels. The digital receiver in the embodiments of the present invention will not discard digital signals, but combine M channels of digital signals into N channels of combined signals.

The combination way includes at least one of the following:

(1) combine a main signal and at least one channel of high-order signal into one channel of combined signal;

(2) combine at least two channels of high-order signals into one channel of combined signal.

Preferably, each combined signal has the same number of bits.

The following specifically describes typical examples of the combination of M channels of digital signals into N channels of combined signals.

Example 1

The digital matrix is a 3×3 matrix (that is to say, the number of receiving channels of the digital receiver is 3) and the number of transmission channels of the digital receiver is 2:

L, R and M respectively represent the magnetic resonance echo signals received by the left, right and middle three side-by-side analog receivers; the digital matrix processor generates a main signal (CP signal), a first high-order signal (LR signal) and a second high-order signal (ACP signal) based on L, R and M. For example, $$CP = \frac{(L-R)}{2} + \frac{j*M}{\sqrt{2}}$$

$$LR = \frac{(L+R)}{\sqrt{2}}$$

$$ACP = \frac{(L-R)}{2} - \frac{j*M}{\sqrt{2}};$$

wherein j is an imaginary unit.

The typical algorithm for the generation of the CP signal, LR signal and ACP signal based on L, R and M in the case of a 3×3 digital matrix is exemplarily described above. Those skilled in the art may know that when the digital matrix is a 3×3 matrix, other algorithms can be used to generate the CP signal, LR signal and ACP signal, and the embodiments of the present invention does not restrict these algorithms.

In one embodiment, combining M channels of digital signals into N channels of combined signals in Step 202 comprises generating a first channel of combined signal based on the CP signal and combining the LR signal and the ACP signal into a second channel of combined signal.

Figure 3:
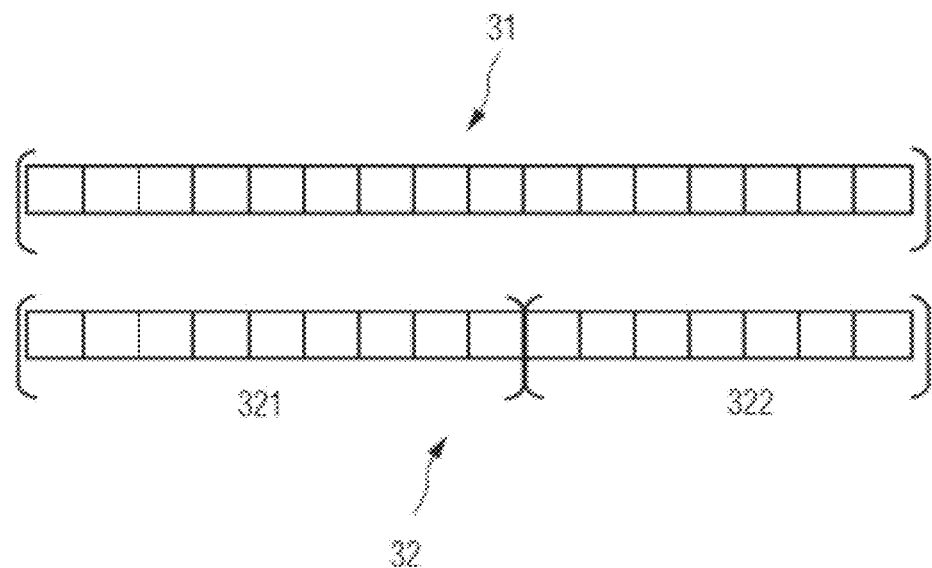
FIG. 3 shows a first exemplary combined signal structure when the number of receiving channels for receiving digital signals is 3 and the number of transmission channels is 2 in the embodiments of the present invention.

FIG. 3 shows a first exemplary combined signal structure when the number of receiving channels for receiving digital signals is 3 and the number of transmission channels is 2 in the embodiments of the present invention.

From FIG. 3, it can be seen that the load field 31 in the first channel of combined signal contains 16 bits which are used to fill the CP signal in, and the load field 32 in the second channel of combined signal contains 16 bits, wherein the first 9 bits 321 are used to fill the LR signal in and the last 7 bits 322 are used to fill the ACP signal in. When the CP signal cannot completely fill up the entire 16 bits of the load field 31 in the first channel of combined signal, a zero can be filled in the redundant bits; when the LR signal cannot completely fill up the first 9 bits of the load field in the second channel of combined signal, a zero can be filled in the redundant bits of the first 9 bits 321; when the ACP signal cannot completely fill up the last 7 bits 322 of the load field in the second channel of combined signal, a zero can be filled in the redundant bits of the last 7 bits 322. Preferably, a discriminator used to discriminate the CP signal from the ACP signal can additionally be set in the second channel of combined signal. In addition, the numbers of the bits respectively occupied by the CP signal, LR signal and ACP signal can be adjusted according to the specific requirements.

In this processing mode, only the CP signal is filled in the first channel of combined signal. Alternatively, the CP signal can be split into the first channel of combined signal and the second channel of combined signal.

In one embodiment, combining M channels of digital signals into N channels of combined signals in Step 202 comprises combining the CP signal and some fields in the LR signal into a first channel of combined signal, and the ACP signal and the other fields in the LR signal into a second channel of combined signal.

Figure 4:
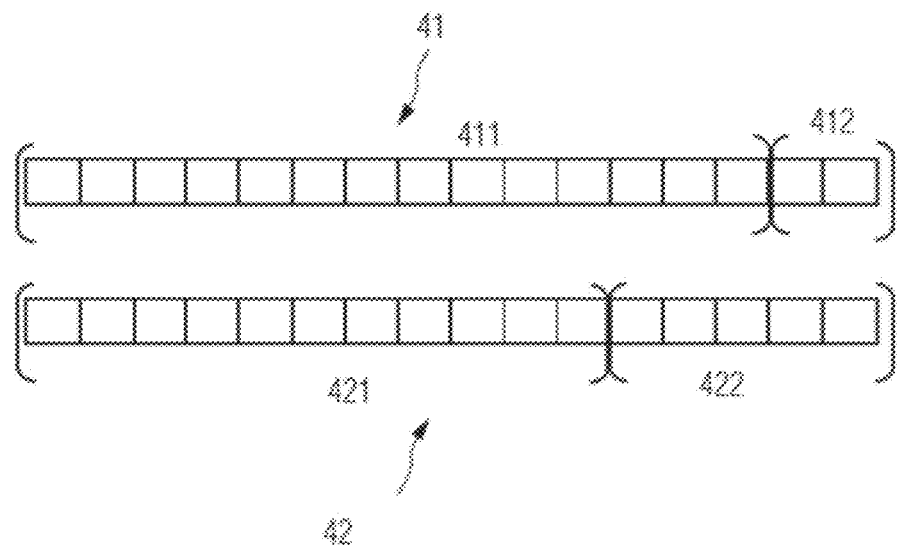
FIG. 4 shows a second exemplary combined signal structure when the number of receiving channels for receiving digital signals is 3 and the number of transmission channels is 2 in the embodiments of the present invention.

FIG. 4 shows a second exemplary combined signal structure when the number of receiving channels for receiving digital signals is 3 and the number of transmission channels is 2 in the embodiments of the present invention.

From FIG. 4, it can be seen that the load field 41 in the first channel of combined signal contains 16 bits, wherein the first 14 bits 411 are used to fill the CP signal in and the last 2 bits 412 are used to fill the first part of the LR signal in; the load field 42 in the second channel of combined signal contains 16 bits, wherein the first 11 bits 421 are used to fill the part other than the first part of the LR signal in and the last 5 bits 422 are used to fill the ACP signal in. When the CP signal cannot completely fill up the first 14 bits 411 of the load field 41 in the first channel of combined signal, a zero can be filled in the redundant bits of the first 14 bits 411; when the first part of the LR signal cannot completely fill up the last 2 bits 412 of the load field 41 in the first channel of combined signal, a zero can be filled in the redundant bits of the last 2 bits 412; when the part other than the first part of the LR signal cannot fill up the first 11 bits 421 of the load field 42 in the second channel of combined signal, a zero can be filled in the redundant bits of the first 11 bits 421; when the ACP signal cannot fill up the last 5 bits 422 of the load field 42 in the second channel of combined signal, a zero can be filled in the redundant bits of the last 5 bits 422. Preferably, in addition, a discriminator used to discriminate the CP signal from the LR signal can be set in the first channel of combined signal, and another discriminator used to discriminate the ACP signal from the LR signal can be set in the second channel of combined signal. In addition, the numbers of the bits respectively occupied by the CP signal, LR signal and ACP signal can be adjusted according to the specific requirements.

Alternatively, combining M channels of digital signals into N channels of combined signals in Step 202 comprises combining the CP signal and some fields in the ACP signal into a first channel of combined signal, and the LR signal and the other fields in the ACP signal into a second channel of combined signal. In this case, the structure of the combined signal is similar to that shown in FIG. 4. The difference is that the first channel of combined signal contains the CP signal and some fields in the ACP signal and the second channel of combined signal contains the LR signal and the other fields in the ACP signal.

Example 2

The digital matrix is a 4×4 matrix (that is to say, the number of receiving channels of the digital receiver is 4) and the number of transmission channels of the digital receiver is 3:

In this case, the input signals of the digital matrix processor are 4 magnetic resonance echo signals received from 4 analog receivers. The digital matrix processor generates 4 digital signals (main signal, first high-order signal, second high-order signal and third high-order signal, respectively) based on the 4 magnetic resonance echo signals.

The algorithm for the digital matrix processor to generate the main signal, first high-order signal, second high-order signal and third high-order signal based on the four magnetic resonance echo signals can include various implementation modes and they are not described here.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises generating a first channel of combined signal based on the main signal, combining the first high-order signal and some fields in the third high-order signal into a second channel of combined signal, and combining the second high-order signal and the other fields in the third high-order signal into a third channel of combined signal.

Figure 5:
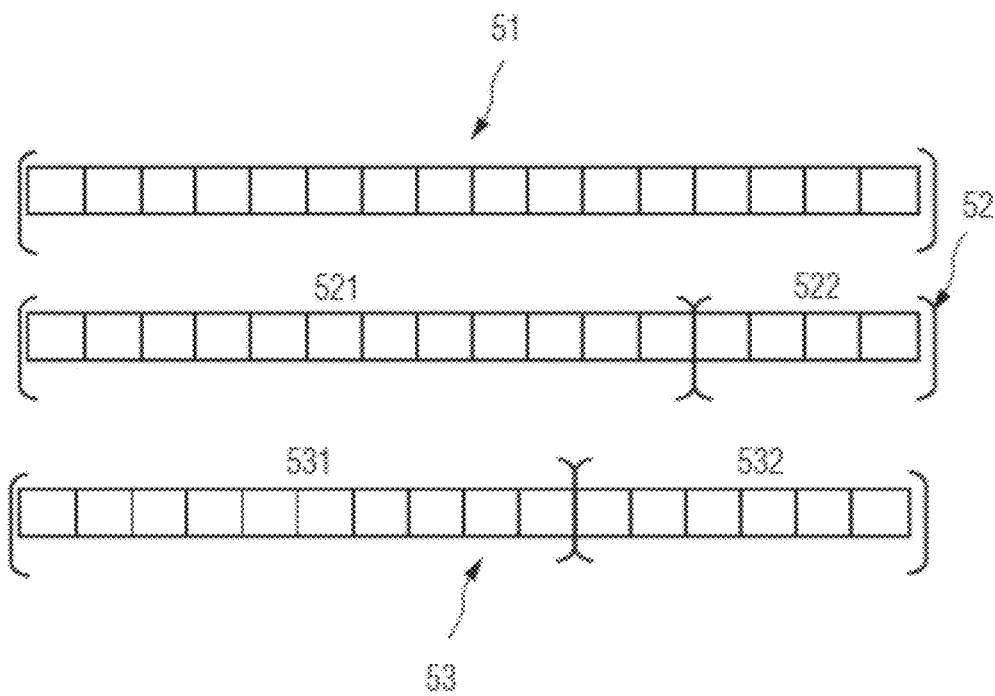
FIG. 5 shows a first exemplary combined signal structure when the number of receiving channels for receiving digital signals is 4 and the number of transmission channels is 3 in the embodiments of the present invention.

FIG. 5 shows a first exemplary combined signal structure when the number of receiving channels for receiving digital signals is 4 and the number of transmission channels is 3 in the embodiments of the present invention.

From FIG. 5, it can be seen that the load field 51 in the first channel of combined signal contains 16 bits which are used to fill the main signal in; the load field 52 in the second channel of combined signal contains 16 bits, wherein the first 12 bits 521 are used to fill the first high-order signal in and the last 4 bits 522 are used to fill the first part of the third high-order signal in; the load field 53 in the third channel of combined signal contains 16 bits, wherein the first 10 bits 531 are used to fill the second high-order signal in and the last 6 bits 532 are used to fill the part other than the first part of the third high-order signal in. When the main signal cannot completely fill up the entire 16 bits of the load field 51 in the first channel of combined signal, a zero can be filled in the redundant bits of the 16 bits; when the first high-order signal cannot completely fill up the first 12 bits 521 of the load field 52 in the second channel of combined signal, a zero can be filled in the redundant bits of the first 12 bits 521; when the first part of the third high-order signal cannot fill up the last 4 bits 522 of the load field 52 in the second channel of combined signal, a zero can be filled in the redundant bits of the last 4 bits 522; when the second high-order signal cannot completely fill up the first 10 bits 531 of the load field 53 in the third channel of combined signal, a zero can be filled in the redundant bits of the first 10 bits 531; when the part other than the first part of the third high-order signal cannot fill up the last 6 bits 532 of the load field 53 in the third channel of combined signal, a zero can be filled in the redundant bits of the last 6 bits 532. Preferably, in addition, a discriminator used to discriminate the first high-order signal from the third high-order signal can be set in the second channel of combined signal, and another discriminator used to discriminate the second high-order signal from the third high-order signal can be set in the third channel of combined signal. In addition, the numbers of the bits respectively occupied by the main signal, the first high-order signal and the third high-order signal can be adjusted according to the specific requirements.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises generating a first channel of combined signal based on the main signal, combining the first high-order signal and some fields in the second high-order signal into a second channel of combined signal, and combining the third high-order signal and the other fields in the second high-order signal into a third channel of combined signal.

Figure 6:
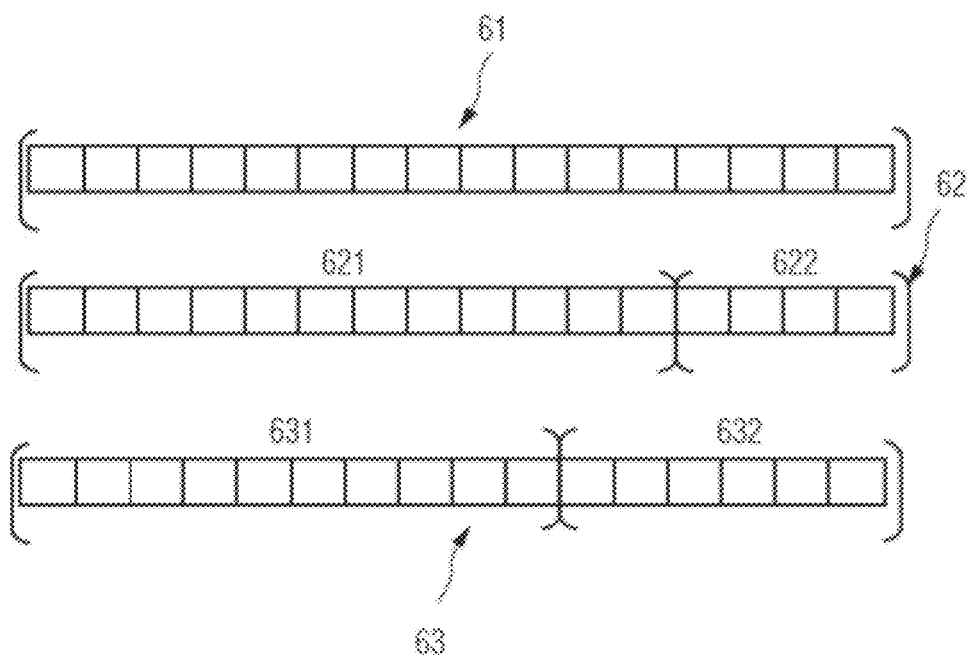
FIG. 6 shows a second exemplary combined signal structure when the number of receiving channels for receiving digital signals is 4 and the number of transmission channels is 3 in the embodiments of the present invention.

FIG. 6 shows a second exemplary combined signal structure when the number of receiving channels for receiving digital signals is 4 and the number of transmission channels is 3 in the embodiments of the present invention.

From FIG. 6, it can be seen that the load field 61 in the first channel of combined signal contains 16 bits which are used to fill the main signal in; the load field 62 in the second channel of combined signal contains 16 bits, wherein the first 12 bits 621 are used to fill the first high-order signal in and the last 4 bits 622 are used to fill the first part of the second high-order signal in; the load field 63 in the third channel of combined signal contains 16 bits, wherein the first 10 bits 631 are used to fill the third high-order signal in and the last 6 bits 632 are used to fill the part other than the first part of the second high-order signal in. When the main signal cannot completely fill up the entire 16 bits of the load field 61 in the first channel of combined signal, a zero can be filled in the redundant bits of the 16 bits; when the first high-order signal cannot completely fill up the first 12 bits 621 of the load field 62 in the second channel of combined signal, a zero can be filled in the redundant bits of the first 12 bits 621; when the first part of the second high-order signal cannot fill up the last 4 bits 622 of the load field 62 in the second channel of combined signal, a zero can be filled in the redundant bits of the last 4 bits 622; when the third high-order signal cannot completely fill up the first 10 bits 631 of the load field 63 in the third channel of combined signal, a zero can be filled in the redundant bits of the first 10 bits 631; when the part other than the first part of the second high-order signal cannot fill up the last 6 bits 632 of the load field 63 in the third channel of combined signal, a zero can be filled in the redundant bits of the last 6 bits 632. Preferably, in addition, a discriminator used to discriminate the first high-order signal from the second high-order signal can be set in the second channel of combined signal, and another discriminator used to discriminate the second high-order signal from the third high-order signal can be set in the third channel of combined signal. In addition, the numbers of the bits respectively occupied by the main signal, the first high-order signal and the third high-order signal can be adjusted according to the specific requirements.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises generating a first channel of combined signal based on the main signal, combining some fields in the first high-order signal and the second high-order signal into a second channel of combined signal, and combining the third high-order signal and the other fields in the first high-order signal into a third channel of combined signal.

Figure 7:
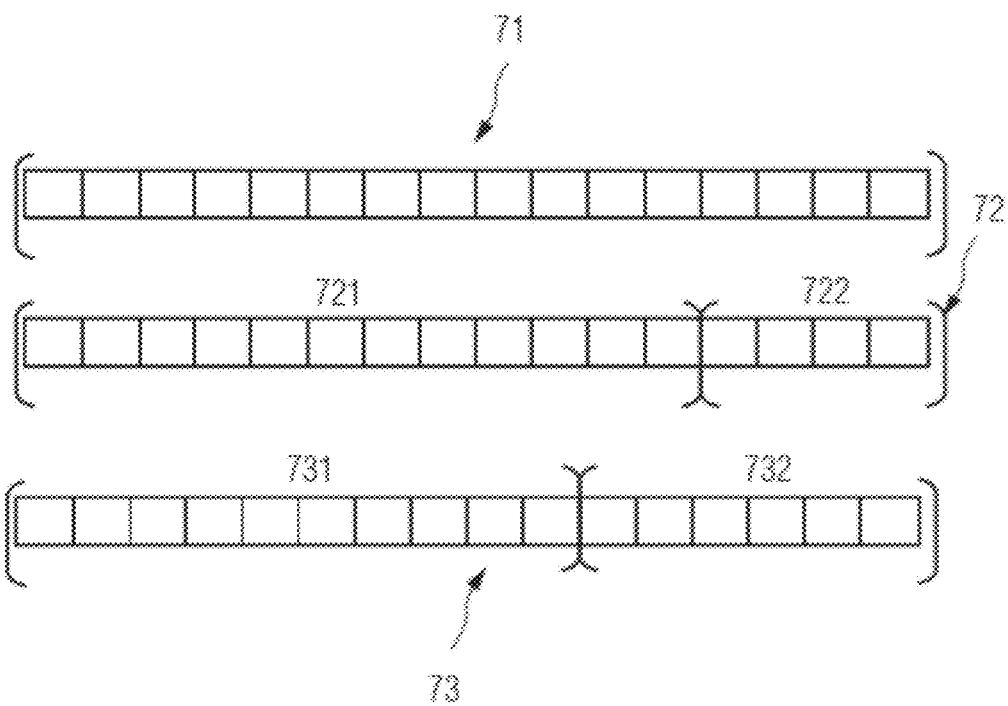
FIG. 7 shows a third exemplary combined signal structure when the number of receiving channels for receiving digital signals is 4 and the number of transmission channels is 3 in the embodiments of the present invention.

FIG. 7 shows a third exemplary combined signal structure when the number of receiving channels for receiving digital signals is 4 and the number of transmission channels is 3 in the embodiments of the present invention.

From FIG. 7, it can be seen that the load field 71 in the first channel of combined signal contains 16 bits which are used to fill the main signal in; the load field 72 in the second channel of combined signal contains 16 bits, wherein the first 12 bits 721 are used to fill the second high-order signal in and the last 4 bits 722 are used to fill the first part of the first high-order signal in; the load field 73 in the third channel of combined signal contains 16 bits, wherein the first 10 bits 731 are used to fill the third high-order signal in and the last 6 bits 732 are used to fill the part other than the first part of the first high-order signal in. When the main signal cannot completely fill up the entire 16 bits of the load field 71 in the first channel of combined signal, a zero can be filled in the redundant bits of the 16 bits; when the second high-order signal cannot completely fill up the first 12 bits 721 of the load field 72 in the second channel of combined signal, a zero can be filled in the redundant bits of the first 12 bits 721; when the first part of the first high-order signal cannot fill up the last 4 bits 722 of the load field 72 in the second channel of combined signal, a zero can be filled in the redundant bits of the last 4 bits 722; when the third high-order signal cannot completely fill up the first 10 bits 731 of the load field 73 in the third channel of combined signal, a zero can be filled in the redundant bits of the first 10 bits 731; when the part other than the first part of the first high-order signal cannot fill up the last 6 bits 732 of the load field 73 in the third channel of combined signal, a zero can be filled in the redundant bits of the last 6 bits 732. Preferably, in addition, a discriminator used to discriminate the second high-order signal from the third high-order signal can be set in the second channel of combined signal, and another discriminator used to discriminate the first high-order signal from the second high-order signal can be set in the third channel of combined signal.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises generating a first channel of combined signal based on the main signal, combining some fields in the first high-order signal and the third high-order signal into a second channel of combined signal, and combining the second high-order signal and the other fields in the first high-order signal into a third channel of combined signal.

Figure 8:
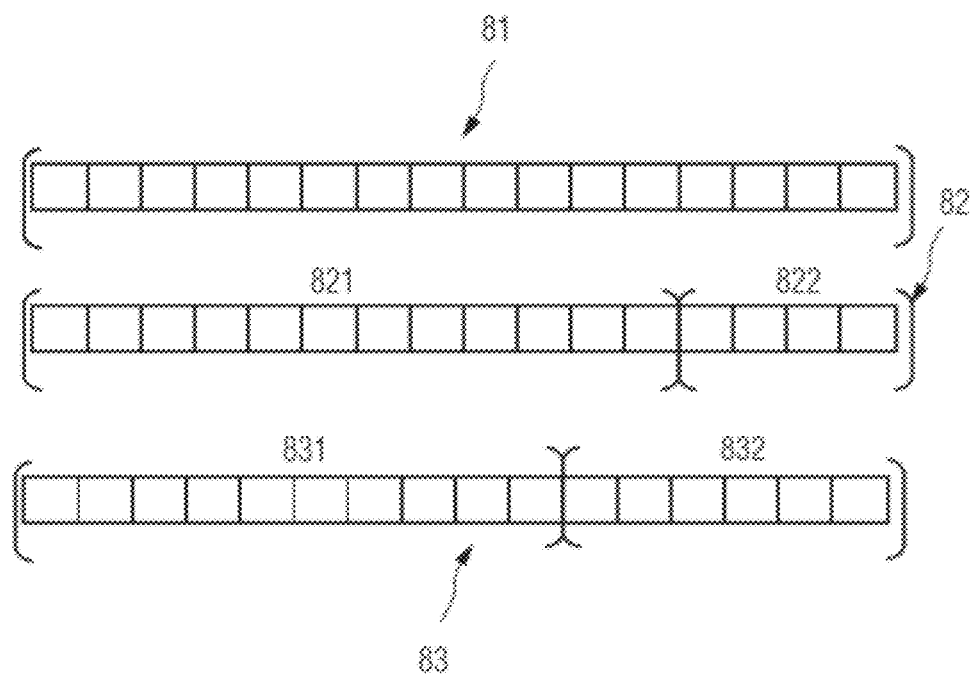
FIG. 8 shows a fourth exemplary combined signal structure when the number of receiving channels for receiving digital signals is 4 and the number of transmission channels is 3 in the embodiments of the present invention.

FIG. 8 shows a fourth exemplary combined signal structure when the number of receiving channels for receiving digital signals is 4 and the number of transmission channels is 3 in the embodiments of the present invention.

From FIG. 8, it can be seen that the load field 81 in the first channel of combined signal contains 16 bits which are used to fill the main signal in; the load field 82 in the second channel of combined signal contains 16 bits, wherein the first 12 bits 821 are used to fill the third high-order signal in and the last 4 bits 822 are used to fill the first part of the first high-order signal in; the load field 83 in the third channel of combined signal contains 16 bits, wherein the first 10 bits 831 are used to fill the second high-order signal in and the last 6 bits 832 are used to fill the part other than the first part of the first high-order signal in. When the main signal cannot completely fill up the entire 16 bits of the load field 81 in the first channel of combined signal, a zero can be filled in the redundant bits of the 16 bits; when the third high-order signal cannot completely fill up the first 12 bits 821 of the load field 82 in the second channel of combined signal, a zero can be filled in the redundant bits of the first 12 bits 821; when the first part of the first high-order signal cannot fill up the last 4 bits 822 of the load field 82 in the second channel of combined signal, a zero can be filled in the redundant bits of the last 4 bits 822; when the second high-order signal cannot completely fill up the first 10 bits 831 of the load field 83 in the third channel of combined signal, a zero can be filled in the redundant bits of the first 10 bits 831; when the part other than the first part of the first high-order signal cannot fill up the last 6 bits 832 of the load field 83 in the third channel of combined signal, a zero can be filled in the redundant bits of the last 6 bits 832. Preferably, in addition, a discriminator used to discriminate the first high-order signal from the third high-order signal can be set in the second channel of combined signal, and another discriminator used to discriminate the first high-order signal from the second high-order signal can be set in the third channel of combined signal. In addition, the numbers of the bits respectively occupied by the main signal, the first high-order signal and the third high-order signal can be adjusted according to the specific requirements.

In the examples shown in FIGS. 5 to 8, only the main signal is filled in the first channel of combined signal. Alternatively, the main signal can be split into a plurality of channels of combined signals.

The following describes the exemplary embodiments of the splitting of the main signal into a plurality of channels of combined signals.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises combining the main signal and some fields in the first high-order signal into a first channel of combined signal, combining some fields in the second high-order signal and the other fields in the first high-order signal into a second channel of combined signal, and combining the other fields in the second high-order signal and the third high-order signal into a third channel of combined signal.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises combining the main signal and some fields in the second high-order signal into a first channel of combined signal, combining the other fields in the second high-order signal and some fields in the first high-order signal into a second channel of combined signal, and combining the other fields in the first high-order signal and the third high-order signal into a third channel of combined signal.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises combining the main signal and some fields in the third high-order signal into a first channel of combined signal, combining the other fields in the third high-order signal and some fields in the first high-order signal into a second channel of combined signal, and combining the other fields in the first high-order signal and the second high-order signal into a third channel of combined signal.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises combining the main signal and some fields in the first high-order signal into a first channel of combined signal, combining the other fields in the first high-order signal and some fields in the third high-order signal into a second channel of combined signal, and combining the second high-order signal and the other fields in the third high-order signal into a third channel of combined signal.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises combining the main signal and some fields in the second high-order signal into a first channel of combined signal, combining the other fields in the second high-order signal and some fields in the third high-order signal into a second channel of combined signal, and combining the first high-order signal and the other fields in the third high-order signal into a third channel of combined signal.

In one embodiment, receiving M channels of digital signals over M receiving channels from the digital matrix processor in Step 201 comprises receiving the main signal, first high-order signal, second high-order signal and third high-order signal over 4 receiving channels from the digital matrix processor; combining M channels of digital signals into N channels of combined signals in Step 202 comprises combining the main signal and some fields in the third high-order signal into a first channel of combined signal, combining the other fields in the third high-order signal and some fields in the second high-order signal into a second channel of combined signal, and combining the first high-order signal and the other fields in the second high-order signal into a third channel of combined signal.

Step 203: Transmit said N channels of combined signals over N transmission channels to the MRI module, wherein one transmission channel corresponds to one channel of combined signal.

Here, the digital receiver transmits N channels of combined signals over N transmission channels to the MRI module, wherein one transmission channel corresponds to one channel of combined signal. The digital receiver can add corresponding fields such as transport protocol packet header and frame structure type to each channel of combined signal, forms N channels of transport packets carrying their respective combined signals, and transmits N channels of transport packets over N transmission channels to the MRI module.

The MRI module analyzes the N channels of transport packets to obtain N channels of combined signals, extracts all digital signals from the N channels of combined signals, and performs a Fourier transform and subsequent processing for all digital signals to form an MRI image. Here, the MRI can utilize the discriminators in the combined signals to discriminate between the digital signals in the combined signals.

The embodiments of the present invention are described in detail in a common scenario where the digital matrix is a 3×3 matrix or 4×4 matrix. Those skilled in the art may know the digital matrix can further be a 5×5 matrix, a 6×6 matrix or any of other matrix forms. The embodiments of the present invention do not restrict the form of the digital matrix.

On the basis of the description above, the present invention further provides a device for transmitting signals in MRI.

Figure 9:
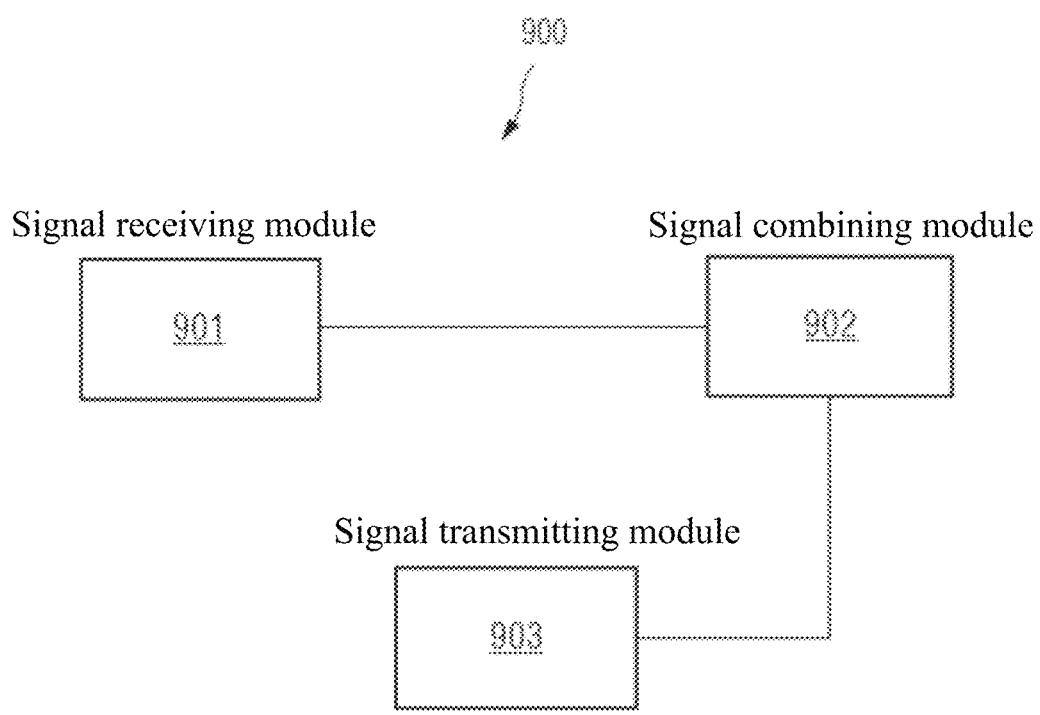
FIG. 9 is a schematic diagram for the device for transmitting signals in MRI in the embodiments of the present invention.

FIG. 9 is a schematic diagram for the device for transmitting signals in MRI in the embodiments of the present invention.

As shown in FIG. 9, the device 900 comprises:

a signal receiving module 901, used to receive M channels of digital signals over M receiving channels from the digital matrix processor, wherein one receiving channel corresponds to one channel of digital signal and M channels of digital signals include one channel of main signal and (M−1) channels of high-order signals;

a signal combining module 902, used to combine M channels of digital signals into N channels of combined signals, wherein the main signal and at least one channel of high-order signal are combined into one channel of combined signal, or at least two channels of high-order signals are combined into one channel of combined signal, N and M are both positive integers, N is less than M, and M is greater than or equal to 2;

a signal transmitting module 903, used to transmit N channels of combined signals over N transmission channels to the MRI module, wherein one transmission channel corresponds to one channel of combined signal.

In one embodiment, M is 3 and N is 2; the signal receiving module 901 is used to receive a main signal, a first high-order signal and a second high-order signal over 3 receiving channels from said digital matrix processor; the signal combining module 902 is used to generate a first channel of combined signal based on the main signal and combine the first high-order signal and the second high-order signal into a second channel of combined signal.

In one embodiment, M is 3 and N is 2; the signal receiving module 901 is used to receive a main signal, a first high-order signal and a second high-order signal over 3 receiving channels from the digital matrix processor; the signal combining module 902 is used to combine the main signal and some fields in the second high-order signal into a first channel of combined signal and combine the first high-order signal and the other fields in the second high-order signal into a second channel of combined signal; or combine the main signal and some fields in the first high-order signal into a first channel of combined signal and combine the second high-order signal and the other fields in the first high-order signal into a second channel of combined signal.

In one embodiment, M is 4 and N is 3; the signal receiving module 901 is used to receive a main signal, a first high-order signal, a second high-order signal and a third high-order signal over 4 receiving channels from said digital matrix processor; the signal combining module 902 is used to generate a first channel of combined signal based on the main signal, combine the first high-order signal and some fields in the third high-order signal into a second channel of combined signal and combine the second high-order signal and the other fields in the third high-order signal into a third channel of combined signal; or generate a first channel of combined signal based on the main signal, combine the first high-order signal and some fields in the second high-order signal into a second channel of combined signal and combine the third high-order signal and the other fields in the second high-order signal into a third channel of combined signal; or generate a first channel of combined signal based on the main signal, combine some fields in the first high-order signal and the second high-order signal into a second channel of combined signal and combine the third high-order signal and the other fields in the first high-order signal into a third channel of combined signal; or generate a first channel of combined signal based on the main signal, combine some fields in the first high-order signal and the third high-order signal into a second channel of combined signal and combine the second high-order signal and the other fields in the first high-order signal into a third channel of combined signal.

In one embodiment, M is 4 and N is 3; the signal receiving module 901 is used to receive a main signal, a first high-order signal, a second high-order signal and a third high-order signal over 4 receiving channels from said digital matrix processor; the signal combining module 902 is used to combine the main signal and some fields in the first high-order signal into a first channel of combined signal, combine some fields in the second high-order signal and the other fields in the first high-order signal into a second channel of combined signal and combine the other fields in the second high-order signal and the third high-order signal into a third channel of combined signal; or combine the main signal and some fields in the second high-order signal into a first channel of combined signal, combine the other fields in the second high-order signal and some fields in the first high-order signal into a second channel of combined signal and combine the other fields in the first high-order signal and the third high-order signal into a third channel of combined signal; or combine the main signal and some fields in the third high-order signal into a first channel of combined signal, combine the other fields in the third high-order signal and some fields in the first high-order signal into a second channel of combined signal and combine the other fields in the first high-order signal and the second high-order signal into a third channel of combined signal; or combine the main signal and some fields in the first high-order signal into a first channel of combined signal, combine the other fields in the first high-order signal and some fields in the third high-order signal into a second channel of combined signal and combine the second high-order signal and the other fields in the third high-order signal into a third channel of combined signal; or combine the main signal and some fields in the second high-order signal into a first channel of combined signal, combine the other fields in the second high-order signal and some fields in the third high-order signal into a second channel of combined signal and combine the first high-order signal and the other fields in the third high-order signal into a third channel of combined signal; or combine the main signal and some fields in the third high-order signal into a first channel of combined signal, combine the other fields in the third high-order signal and some fields in the second high-order signal into a second channel of combined signal and combine the first high-order signal and the other fields in the second high-order signal into a third channel of combined signal.

The present invention further provides a digital receiver of an MRI system. The digital receiver comprises the device for transmitting signals in MRI as claimed in any of claims 5 to 8.

In compliance with a certain application program interface, the method for transmitting signals in MRI in the embodiments of the present invention can be compiled into a plug-in mounted in a magnetic resonance diffusion weighted imaging (MR-DWI) controlling host, personal computer or mobile terminal, or can also be encapsulated an application program for users to download.

The method for transmitting signals in MRI in the embodiments of the present invention can be stored in the form of instructions or an instruction set in various storage media. The storage media include but are not limited to floppy disks, compact disks, DVDs, hard disks, and flashes.

In addition, the method for transmitting signals in MRI in the embodiments of the present invention can be applied to Nand flash based storage media, for example, universal serial bus (USB) disk, compact flash (CF) card, secure digital (SD) card, secure digital high capacity (SDHC) card, multimedia card (MMC), smart media (SM) card, memory stick, and eXtreme digital (XD) card.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for transmitting signals in magnetic resonance imaging, comprising:
   receiving M channels of digital signals over M receiving channels from a digital matrix processor, wherein one receiving channel corresponds to one channel of digital signal and said M channels of digital signals include one channel of main signal and (M−1) channels of high-order signals;
   digitally combining said M channels of digital signals into N channels of combined digital signals,
   wherein said main signal and at least one channel of high-order signal are digitally combined into one channel of the N channels of combined digital signals, or at least two channels of high-order signals are digitally combined into one channel of the N channels of the combined digital signals, with N and M both being positive integers, N being less than M, and M being greater than or equal to 2; and
   transmitting said N channels of combined digital signals over N transmission channels to a magnetic resonance imaging module,
   wherein one transmission channel corresponds to one channel of the N channels of combined digital signals.

2. The method for transmitting signals in magnetic resonance imaging as claimed in claim 1, wherein M is 3 and N is 2, comprising:
   receiving M channels of digital signals over M receiving channels from a digital matrix processor by receiving a main signal, a first high-order signal, and a second high-order signal over 3 receiving channels from said digital matrix processor; and
   digitally combining the received M channels of digital signals into the N channels of combined digital signals by:
      generating a first channel of the N channels of combined digital signals based on said main signal; and
      digitally combining said first high-order signal and said second high-order signal into a second channel of the N channels of combined digital signals.

3. The method for transmitting signals in magnetic resonance imaging as claimed in claim 1, wherein M is 3 and N is 2, and comprising:
   receiving M channels of digital signals over M receiving channels from a digital matrix processor by receiving a main signal, a first high-order signal, and a second high-order signal over 3 receiving channels from said digital matrix processor; and
   digitally combining the received M channels of digital signals into N channels of combined digital signals by:
      digitally combining said main signal and a portion of second high-order signal fields in said second high-order signal into a first channel of the N channels of combined digital signals;
      digitally combining said first high-order signal and the remaining portion of second high-order signal fields in said second high-order signal into a second channel of the N channels of combined digital signals;
      digitally combining said main signal and a portion of first high-order signal fields in said first high-order signal into the first channel of the N channels of combined digital signals; and
      digitally combining said second high-order signal and the remaining portion of first high-order signal fields in said first high-order signal into the second channel of the N channels of combined digital signals.

4. The method for transmitting signals in magnetic resonance imaging as claimed in claim 1, wherein M is 4 and N is 3, and comprising:
   receiving M channels of digital signals over M receiving channels from a digital matrix processor by receiving a main signal, a first high-order signal, a second high-order signal, and a third high-order signal over 4 receiving channels from said digital matrix processor; and
   digitally combining the received M channels of digital signals into N channels of combined digital signals by performing at least one of:
      (i) generating a first channel of the N channels of combined digital signals based on said main signal combining said first high-order signal and a portion of third high-order signal fields in said third high-order signal into a second channel of the N channels of combined digital signals, and combining said second high-order signal and the remaining portion of the third high-order signal fields in said third high-order signal into a third channel of the N channels of combined digital signals;
      (ii) generating a first channel of the N channels of combined digital signals based on said main signal combining said first high-order signal and a portion of second high-order fields in said second high-order signal into a second channel of the N channels of combined digital signals and combining said third high-order signal and the remaining portion of second high-order fields in said second high-order signal into a third channel of the N channels of combined digital signals;
      (iii) generating a first channel of the N channels of combined digital signals based on said main signal combining a portion of first high-order fields in said first high-order signal and said second high-order signal into a second channel of the N channels of combined digital signals, and combining said third high-order signal and the remaining portion of first high-order fields in said first high-order signal into a third channel of the N channels of combined digital signals; and (iv) generating a first channel of the N channels of combined digital signals based on said main signal, combining a portion of fields in said first high-order signal and said third high-order signal into a second channel of the N channels of combined digital signals and combining said second high-order signal and the remaining portion of fields in said first high-order signal into a third channel of the N channels of combined digital signals.

5. The method for transmitting signals in magnetic resonance imaging as claimed in claim 1, wherein digitally combining the M channels of digital signals into the N channels of combined digital signals comprises at least one of the N channels of combined digital signals having bits associated with at least two different ones of the M channels.

6. The method for transmitting signals in magnetic resonance imaging as claimed in claim 1, wherein each one of the N channels of combined digital signals includes the same number of bits.

7. A device for transmitting signals in magnetic resonance imaging, comprising:
a signal receiving module configured to receive M channels of digital signals over M receiving channels from a digital matrix processor, wherein one receiving channel corresponds to one channel of digital signals, and said M channels of digital signals include one channel of a main signal and (M−1) channels of high-order signals;
a signal combining module configured to digitally combine said M channels of digital signals into N channels of combined digital signals, wherein said main signal and at least one channel of the high-order signal are combined into one channel of the N channels of combined digital signals, or at least two channels of high-order signals are combined into one channel of the N channels of combined digital signals,
wherein N and M are both positive integers, N is less than M, and M is greater than or equal to 2; and
a signal transmitting module configured to transmit said N channels of combined digital signals over N transmission channels to a magnetic resonance imaging module,
wherein one transmission channel corresponds to one channel of the N channels of combined digital signals.

8. The device for transmitting signals in magnetic resonance imaging as claimed in claim 7, wherein M is 3 and N is 2, and wherein:
said signal receiving module is configured to receive a main signal, a first high-order signal, and a second high-order signal over 3 receiving channels from said digital matrix processor; and
said signal combining module is configured to generate a first channel of the N channels of combined digital signals based on said main signal and to combine said first high-order signal and said second high-order signal into a second channel of the N channels of combined digital signals.

9. The device for transmitting signals in magnetic resonance imaging as claimed in claim 7, wherein M is 3 and N is 2, and wherein:
said signal receiving module is configured to receive a main signal, a first high-order signal, and a second high-order signal over 3 receiving channels from said digital matrix processor; and
said signal combining module is configured to (i) digitally combine said main signal and a portion of second high-order signal fields in said second high-order signal into a first channel of the N channels of combined digital signals, and digitally combine said first high-order signal and the remaining portion of second high-order signal fields in said second high-order signal into a second channel of the N channels of combined digital signals, or (ii) digitally combine said main signal and a portion of first high-order signal fields in said first high-order signal into a first channel of the N channels of combined digital signals, and to digitally combine said second high-order signal and the remaining portion of first high-order fields in said first high-order signal into a second channel of the N channels of combined digital signals.

10. The device for transmitting signals in magnetic resonance imaging as claimed in claim 7, wherein M is 4 and N is 3, and wherein:
said signal receiving module configured to receive a main signal, a first high-order signal, a second high-order signal, and a third high-order signal over 4 receiving channels from said digital matrix processor; and
said signal combining module is configured to digitally combine the received M channels of digital signals into N channels of combined digital signals by performing at least one of:
(i) generating a first channel of the N channels of combined digital signals based on said main signal, digitally combining said first high-order signal and a portion of third high-order signal fields in said third high-order signal into a second channel of the N channels of combined digital signals, and digitally combining said second high-order signal and the remaining portion of third high-order signal fields in said third high-order signal into a third channel of the N channels of combined digital signals;
(ii) generating a first channel of the N channels of combined digital signals based on said main signal, digitally combining said first high-order signal and a portion of second high-order fields in said second high-order signal into a second channel of the N channels of combined digital signals, and digitally combining said third high-order signal and the remaining portion of second high-order fields in said second high-order signal into a third channel of the N channels of combined digital signals;
(iii) generating a first channel of the N channels of combined signals based on said main signal, digitally combining a portion of first high-order fields in said first high-order signal and said second high-order signal into a second channel of the N channels of combined digital signals, and digitally combining said third high-order signal and the remaining portion of first high-order fields in said first high-order signal into a third channel of the N channels of combined digital signals; and
(iv) generating a first channel of the N channels of combined digital signals based on said main signal, digitally combining a portion of first high-order fields in said first high-order signal and said third high-order signal into a second channel of the N channels of combined digital signals, and digitally combining said second high-order signal and the remaining portion of first high-order fields in said first high-order signal into a third channel of the N channels of combined digital signals.

11. A non-transitory, computer-readable data storage medium encoded with programming instructions, said storage medium being loaded into a computer of a magnetic resonance imaging apparatus, and said programming instructions causing said computer, when executing the programming instructions, to:

receive M channels of digital signals over M respective receiving channels from a digital matrix processor, wherein said M channels of digital signals include one channel of a main signal and (M−1) channels of high-order signals;

digitally combine said received M channels of digital signals into N channels of combined digital signals, wherein said main signal and at least one channel of the high-order signals are digitally combined into one channel of the N channels of combined digital signals, or at least two channels of high-order signals are digitally combined into one channel of the N channels of combined digital signals, wherein N and M are both positive integers, N is less than M, and M is greater than or equal to 2; and transmit said N channels of combined signals over N transmission channels to a magnetic resonance imaging module, wherein one transmission channel corresponds to one channel of the N channels of combined digital signals.

* * * * *